United States Patent [19]
Apelgren et al.

[11] Patent Number: 5,780,861
[45] Date of Patent: Jul. 14, 1998

[54] ADJUSTABLE BLADE RETICLE ASSEMBLY

[75] Inventors: Eric M. Apelgren; Darrell A. Harris, both of Austin, Tex.

[73] Assignee: Advanced Micro Devices, Inc., Sunnyvale, Calif.

[21] Appl. No.: 756,494

[22] Filed: Nov. 26, 1996

[51] Int. Cl.⁶ .................................................. G21K 5/00
[52] U.S. Cl. .................................. 250/492.2; 250/492.1
[58] Field of Search .......................... 250/492.1, 492.2, 250/492.3

[56] References Cited

U.S. PATENT DOCUMENTS

| | | | |
|---|---|---|---|
| 4,425,037 | 1/1984 | Hershel et al. | 355/43 |
| 5,097,137 | 3/1992 | Ogoh | 250/492.1 |
| 5,347,134 | 9/1994 | Hashimoto | 250/492.1 |
| 5,703,675 | 12/1997 | Hirukawa et al. | 355/363 |

*Primary Examiner*—Bruce Anderson
*Attorney, Agent, or Firm*—Kevin L. Daffer; Conley, Rose & Tayon

[57] ABSTRACT

Apparatus and method for inhibiting the image of a transparent, undesired feature on a reticle from printing on semiconductor material. The apparatus includes a frame attachment connected to a pellicle frame that is attached to a reticle. A blade that is opaque to ultraviolet light is moveable across the frame attachment and may be positioned proximate the undesired feature of the reticle to prevent the printing of the image of the undesired feature on the semiconductor material. The blade may be positioned above the undesired feature to inhibit ultraviolet light from an illumination source from impinging upon the undesired feature. Alternatively, the blade may be positioned below the undesired feature to inhibit ultraviolet light passing through the undesired feature from impinging upon the semiconductor material.

23 Claims, 5 Drawing Sheets

ADJUSTABLE BLADE RETICLE ASSEMBLY

BACKGROUND OF THE INVENTION

1. Field of the Invention

The present invention generally relates to an assembly used in the printing of images contained on a reticle onto semiconductor material. More particularly, embodiments of the invention relate to an apparatus adapted for attachment to a pellicle frame on a reticle. The apparatus inhibits undesired reticle features from printing onto the semiconductor material.

2. Description of the Related Art

Some reticles used for producing patterns on semiconductor material (e.g., wafers) contain features (e.g., stepper alignment markings) which need not, in all instances, be printed on the wafer. If the image of the feature is printed onto a device image located on the semiconductor material, the circuit layout of the device may be altered. If such an occurrence goes undetected after the develop stage of fabrication, the device may fail at sort and the semiconductor material may have to be scrapped.

Some conventional methods for repairing a clear reticle defect involve depositing chromium onto the defect. One such method involves decomposing a chromium-containing gas by pyrolysis. The gas is supplied to the reticle surface in the vicinity of the defect and an argon laser beam is projected onto the defect. The laser beam heats the defect surface to about 150° C., causing chromium from the gas to be deposited onto the defect surface, making the defect opaque. Another method involves the use of a focused ion beam to deposit chromium onto the surface of a defect. Yet another method relates to covering the defect with an epoxy that is delivered by a pipette or similar device. Such methods tend to be difficult to perform and time consuming. Furthermore, the above-described methods are primarily useful where the defect is relatively small (e.g., about 1–2 μm in length). Such methods may not be adapted to repair undesired features such as alignment markings and other reticle defects that tend to be much larger. Moreover, it may be undesirable to permanently alter a feature such as an alignment marking if the reticle containing the marking will subsequently be used in a stepper (e.g., GCA stepper) that requires such markings.

Additionally, opaque material (e.g. epoxy) deposited over the defect may be inadvertently removed when the reticle surface is periodically cleaned. The deposited material may also flake from the reticle surface at higher temperatures and contaminate the wafer. It is generally preferred that the reticle surface not be altered to correct a surface defect and/or prevent the printing of an undesired feature onto a semiconductor wafer.

Another conventional method of preventing the aforementioned problem include the use of a reticle masking apparatus. FIG. 1 depicts a PAS 5000/50 illumination system that includes a reticle masking apparatus 32. The illumination system includes a lamp 12 connected to an automatic lamp positioning system 10. Light is directed from elliptical mirror 14 to blue cold mirror 18 and through shutter 16 to integrator block 20, which contains integrator 22 and variable zoom lens 26. The light passes from the integrator block to mirror 24, which further directs the light through condensor lens 28. An energy integrator 30 is positioned proximate the condensor lens. Reticle masking apparatus 32 blocks a portion of the light passing from the condensor lens to reticle 34. Systems that operate in this manner are well known to those skilled in the art.

An enlarged view of the reticle masking apparatus is shown in FIG. 2. The reticle masking apparatus typically includes masking blades 36 that are attached to a spindle 38. The spindle is rotated to extend or retract the masking blades to prevent light from the illumination source from contacting the undesired feature on the reticle. The reticle masking apparatus typically is positioned above the reticle at distance of at least about 60 mm. Reticle masking systems tend to be characterized by an inherent mechanical invariability. The reticle masking blades tend to occasionally permit light to impinge upon undesired features of the reticle, resulting in the printing of these features onto the semiconductor material.

In some cases where the blades of the reticle masking system are positioned above the undesired marking, the marking may be printed onto the semiconductor material due to light that diffracts around the blades and impinges upon the undesired feature on the reticle. The typical reticle masking system is therefore separate from and spaced a substantial distance above the reticle. The separate and spaced configuration of the reticle masking system relative to the reticle produces a disproportionally high amount of aperture shadowing on the reticle. That is, a discontinuous pattern of light is impinged upon a portion of the reticle due to diffraction of light that is caused by the blades of the reticle masking apparatus. To ensure that the undesired image is not printed onto the wafer, the blades of the reticle masking system must often be extended to a relatively great degree. The positioning of the reticle masking blades in this manner may occasionally result in the projection of a discontinuous light pattern onto at least a portion of a device image on the reticle. The reticle masking blades may therefore cast a shadow over a portion of the device image on the reticle. Consequently, the device image may be improperly printed on the semiconductor material.

It is therefore desirable that a reticle masking system be derived which blocks passage of light to undesired areas (e.g., defect areas, alignment marker areas) on the wafer while permitting passage of light to desired areas (e.g., regions of the wafer where active circuit topography is to be printed). The desired masking system should therefore operate with minimal deleterious diffraction/shadowing effects.

SUMMARY OF THE INVENTION

In accordance with the present invention, an assembly is provided that largely eliminates or reduces the aforementioned disadvantages of conventional reticle masking systems and methods. The assembly is preferably positioned to block light from impinging upon undesired areas of the wafer or reticle without causing shadowing over areas which are selected to receive light. The assembly preferably does not alter or contaminate the surface of the reticle.

An embodiment of the invention relates to an assembly for inhibiting the image of an undesired reticle feature from being printed onto a wafer. The assembly includes a pellicle that is drawn across a pellicle frame that is connected to a reticle. A frame attachment is connected to the pellicle frame, and the frame attachment includes a first section and a second section. The first section and the second section each include a top and a side. The first section is preferably parallel to the second section, and the sections are connected to the pellicle frame. A blade extends from the first section of the frame attachment to the second section of the frame attachment. One end of the blade engages the frame attachment proximate the first section, and another end of the blade engages the frame attachment proximate the second section. The blade is moveable back and forth in a direction that is substantially parallel to the first section and the second section of the frame attachment.

The reticle may contain an undesired feature that is transparent to ultraviolet light and located on the surface of the reticle in the vicinity of a device image. The frame attachment is preferably attached to a pellicle frame that is located on the top surface of the reticle. The blade may be positioned directly over the undesired image to prevent ultraviolet light-from an overhead illumination source from impinging upon the undesired feature and printing upon semiconductor material positioned below the reticle. The blade preferably does not inhibit light from impinging upon the device image on the reticle. The blade preferably casts a shadow over the undesired feature that does not cover any portion of the device image. It is preferred that blade be positioned such that it (a) prevents the image of the undesired feature from printing on the wafer, and (b) does not cause either shadowing on the device image or a discontinuous pattern of light to impinge upon the device image.

Alternatively, the frame attachment may be attached to a pellicle frame located on the bottom side of the reticle. The blade is positioned below the undesired feature to inhibit light that passes through the undesired feature from impinging upon the semiconductor material positioned below the reticle. The blade is preferably positioned such that it (a) prevents the image of the undesired feature from printing on the wafer, and (b) does not interfere with the ultraviolet light passing through the device image on the reticle.

An advantage of the invention relates to preventing an undesired image from printing onto semiconductor material without inhibiting the printing of a device image onto the semiconductor material.

Another advantage of the invention relates to inhibiting ultraviolet light from impinging upon an undesired reticle feature.

Yet another advantage of the invention relates to inhibiting ultraviolet light passing through an undesired reticle feature from impinging upon semiconductor material.

Still another advantage of the invention relates to inhibiting the printing of an undesired feature onto a wafer without altering or contaminating the surface of the reticle.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
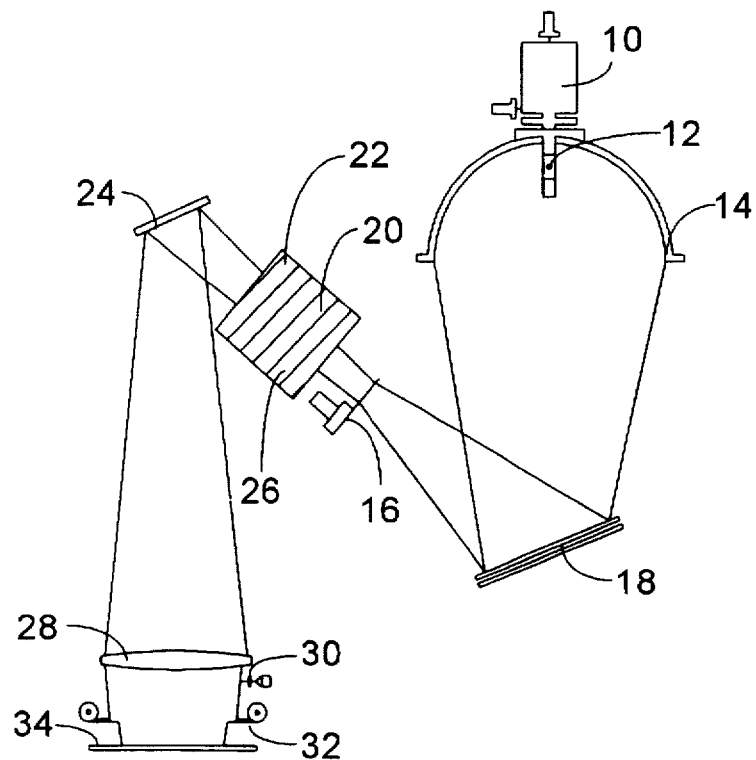
FIG. 1 depicts a PAS 5000/50 Illumination System of the prior art.
Figure 2:
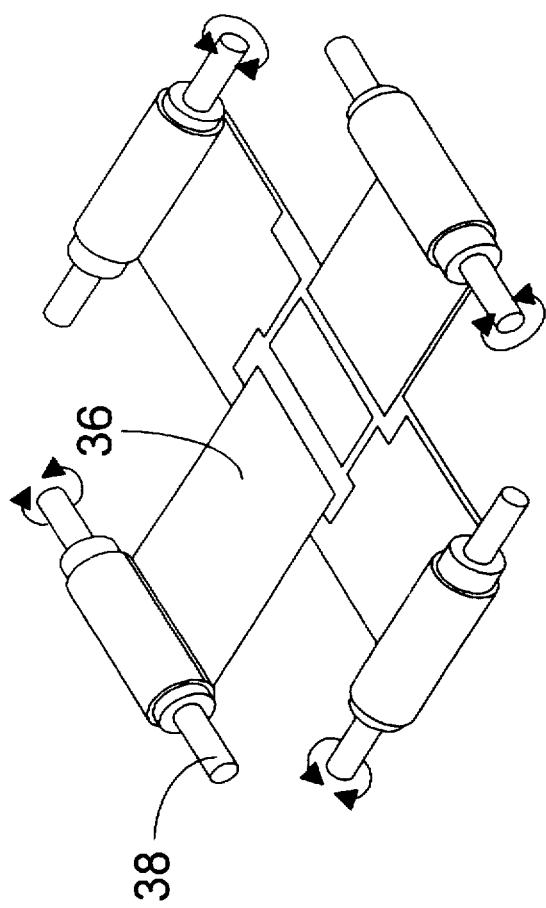
FIG. 2 depicts a reticle masking system of the prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 3:
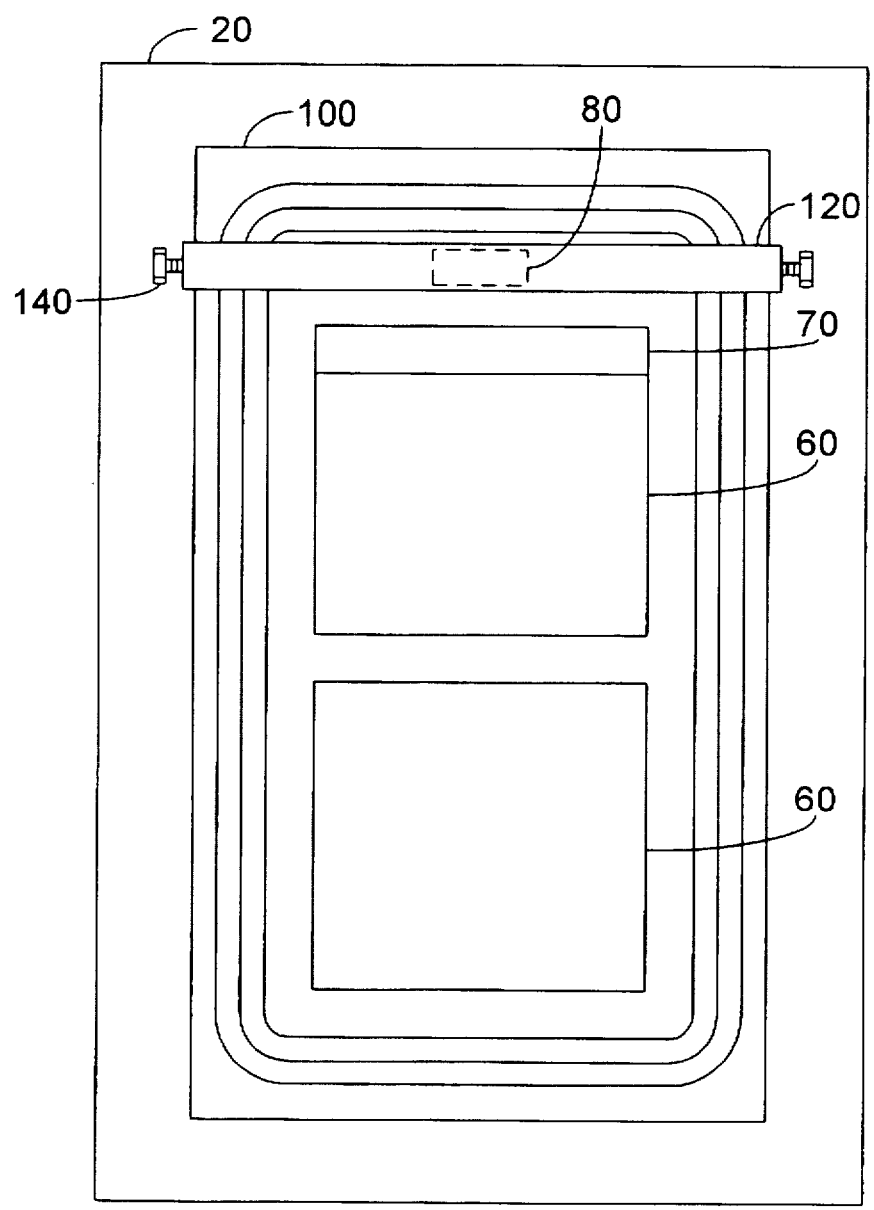
FIG. 3 depicts a top view of an embodiment of the invention.

An embodiment of the invention is shown in FIG. 3. A reticle 20 contains one or more device image(s) 60 to be printed onto a semiconductor substrate or semiconductor topography (e.g., semiconductor wafer). Methods of printing such reticle images onto semiconductor material are well known to those skilled in the art. The reticle preferably contains a side having a surface that contains glass and a side having a surface that contains chromium. The reticle also contains pellicle 40 (shown in FIG. 5) for inhibiting contaminant particles (e.g., dirt) from contacting a portion of the surface of the reticle. The pellicle may be a film of material (e.g. cellophane) that is drawn across a pellicle frame 50 (shown in FIG. 4) that is attached to the surface of the reticle. The pellicle frame preferably protrudes from the surface of the reticle to an extent that contaminant particles resting on the pellicle are removed from the reticle surface by a sufficient distance that images of such particles will not print onto the semiconductor material. A pellicle frame may extend from the top and/or bottom surface of the reticle. The reticle may contain an undesired feature 80 that is proximate device image 60. The marking 80 may be a transparent stepper alignment marking such as a Digital Fine Alignment System (DFAS) marking that is typically used in conjunction with a GCA stepper. In addition to an undesired alignment marking, marking 80 may be any defect that is at least substantially transparent to ultraviolet light including a bubble, scratch, fracture, pinhole, void, chemical anomaly, etc.

Figure 4:
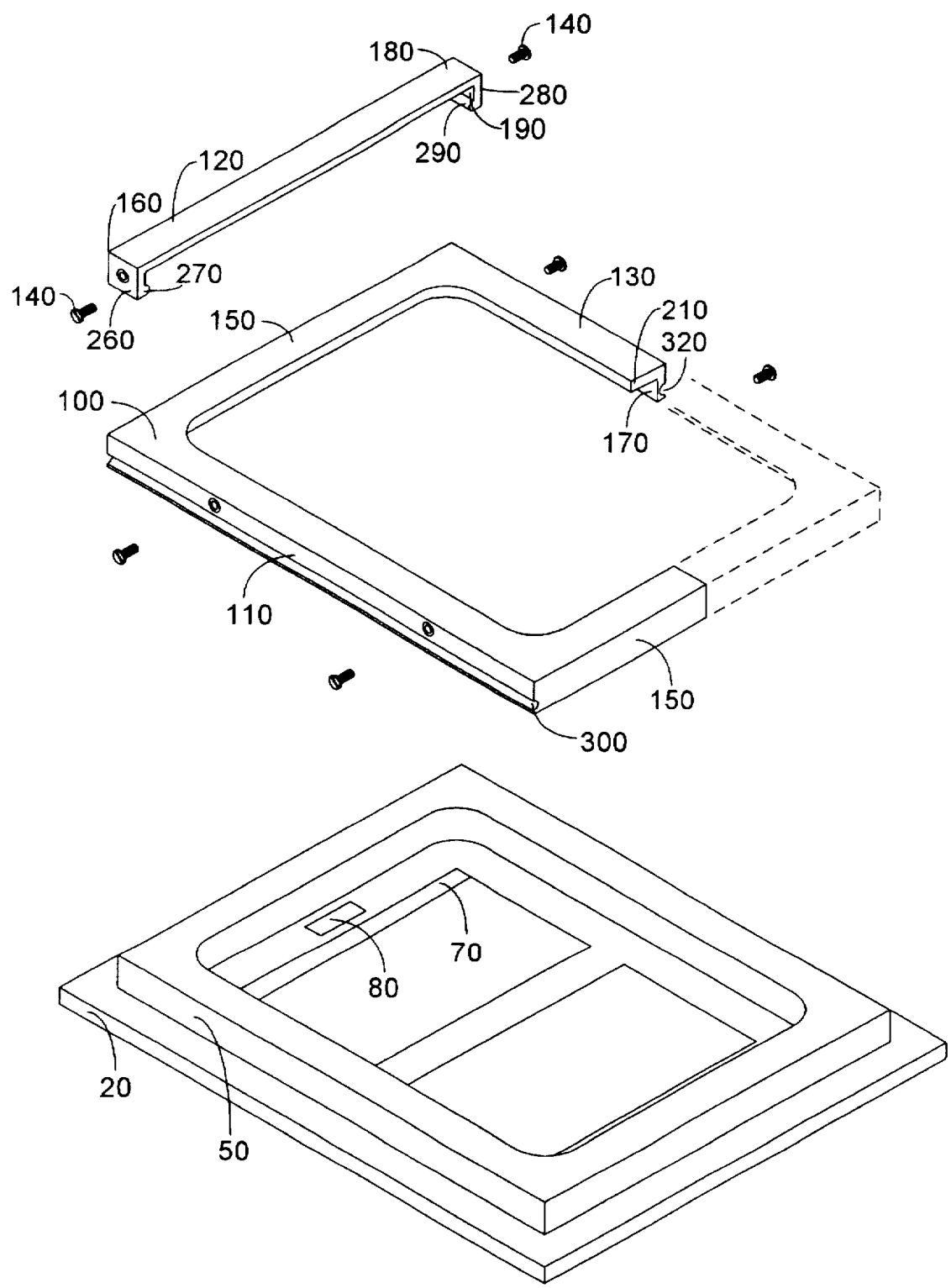
FIG. 4 depicts an exploded perspective view of an embodiment of the invention.
Figure 5:
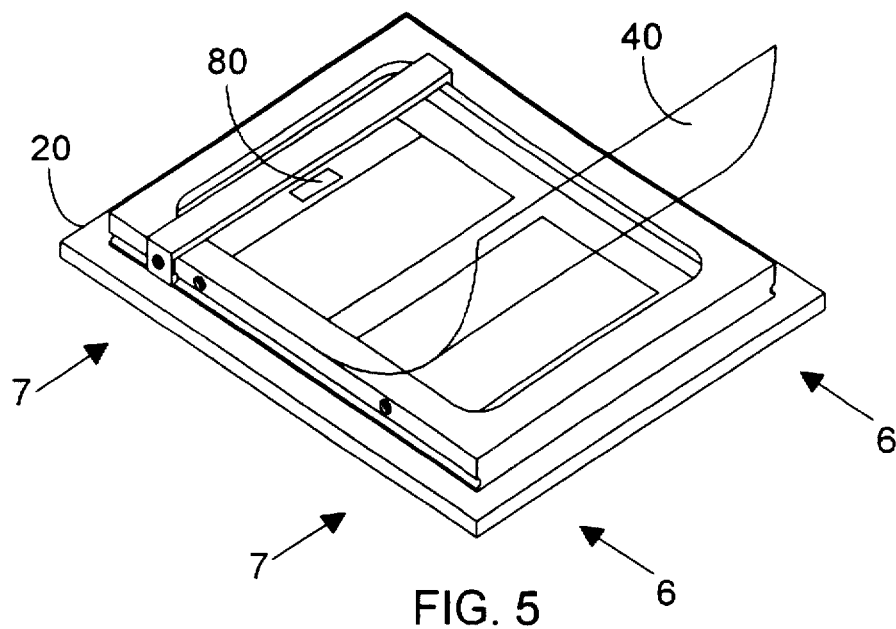
FIG. 5 depicts a perspective view of an embodiment of the invention.

A perspective view of an embodiment of the invention is shown in FIG. 4. In this embodiment, a frame attachment 100 is attached over the pellicle frame to provide a support onto which a member or blade 120 may be positioned to inhibit light from an ultraviolet illumination source from impinging upon marking 80. Frame attachment 100 preferably includes a first section 110 and a second section 130 that each have a top and a side. The first section 110 and the second section 130 are preferably aligned substantially parallel to one another. The first section and the second section may be connected to one another via one or more frame attachment sections 150 that are preferably aligned substantially perpendicular to the first section and the second section. In an embodiment, the frame attachment 100 is a single portion having a rectangular shape that substantially conforms to the shape of the pellicle frame. Alternately, the first section 110 and the second section 130 may be separately engaged to the pellicle frame without frame attachment section 150.

At least one of the frame attachment sections (i.e., 110, 130 or 150) is preferably fixably engaged with the pellicle frame. At least one of the sections of the frame attachment preferably contains a connector extending through it and into the pellicle frame. In an alternate embodiment, the sections 110, 130, and/or 150 contain one or more protrusions on inner surface 170 that are adapted to "snap" into an opening on the outside surface of the pellicle frame to form a removable engagement between the frame attachment section and the pellicle frame. It is preferred that each of the frame attachment sections be connected to the pellicle frame by one or more connectors or protrusions. The connectors are preferably screws.

In an embodiment of the invention, a blade 120 having a first end 160 and a second end 180 extends across the frame attachment such that the first end of the blade is engaged with the frame attachment proximate the first section 110, and the second end of the blade is engaged with the frame attachment proximate the second section 130. Blade 120 is preferably opaque to ultraviolet light and adapted to move back and forth on top of the frame attachment 100 in a direction that is substantially parallel to the first section 110 and the second section 130. The blade is preferably moveable along the entire length of first section 110 and second section 130. The blade may be connected to frame attachment 100 by at least one connector 140, which is preferably a screw.

In an embodiment, connector 140 extends through the top surface of the blade into the top of one of the sections of the frame attachment. Two connectors may be used to attach the blade to the frame attachment such that one connector extends through the top surface of the blade at a location proximate first end 160 of the blade, and a second connector extends through the top surface of the blade at a location proximate second end 180 of the blade. The connectors preferably provide a frictional engagement between the blade and the frame attachment to lock the blade into a desired position and inhibit the blade from sliding across the top of the first and second sections of the frame attachment. The connectors may be loosened to allow the movement of the blade in a direction substantially parallel to the first and second sections of the frame attachment. The connectors may be removed to allow the blade to be disengaged from the frame attachment and repositioned. It is preferred that the connector(s) that extend through the top surface of the blade are flush with the top surface, since connectors that protrude from the top surface to a significant degree may interfere with the positioning of the reticle in a stepper. It is to be understood that connecting the blade to the frame attachment in this manner does not require that the blade include side portions 260 and 280.

In an embodiment of the invention, blade 120 may be fixed onto frame attachment 100 without connectors that extend into the blade. The first end 160 of the blade may form an "interference fit" with the first section 110 of the frame attachment, and the second end of the blade may form an "interference fit" with the second section 130 of the frame attachment. An "interference fit" means an engagement between the blade 120 and the frame attachment 100 primarily maintained by friction between the inner surface 190 of each portion of the blade and the outer surface of the frame attachment. In an embodiment, blade 120 has a length that is substantially equal to the shortest distance between the side of the first section 110 and the side of the second section 130 of the frame attachment. The length of the blade may cause the portion of inner surface 190 proximate the first side 160 of the blade to frictionally engage the outer side of first section 110, while the inner surface 190 of the second side 180 of the blade frictionally engages the outer side of second section 130. The interference fit preferably allows the blade to slide in a direction substantially parallel to the first and second sections of the frame attachment when a pre-determined force is applied to the blade. The interference fit preferably maintains the blade in a fixed position in the absence of a force of pre-determined magnitude. In this manner, the use of connectors that otherwise might interfere with the positioning of the reticle within a stepper is unnecessary.

It has been found, however, that blade 120 may tend to "bow" in an upward direction when it is attached to the frame attachment by friction alone (e.g., interference fit). Such bowing may be due to an imperfect interference fit between the blade and the frame attachment. Bowing can cause the blade to exceed a pre-determined height above the pellicle frame. Bowing may also cause shadowing effects that may (a) allow at least a portion of the image of the undesired feature to print onto the semiconductor material, or (b) prevent light from impinging upon a portion of device image 60. The use of a blade that forms an interference fit with the frame attachment may require the blade to be (a) manufactured with a relatively low tolerance and (b) replaced periodically if the blade is bent during removal and/or positioning of the blade.

In an embodiment of the invention, the side of first section 110 includes a groove 300 extending along the length of the first section, and the side of the second section includes a groove 320 extending along the length of the second section. The first end 160 of the blade may include an inwardly disposed protrusion 270 adapted to fit within the groove 300, and the second end 180 of the blade may include an inwardly disposed protrusion 290 adapted to fit within groove 320. The blade is preferably slipped onto the end of the frame attachment such that the inwardly disposed protrusions 270 and 290 within grooves 300 and 320, respectively, maintain an engagement between the blade and the frame attachment. Although connectors 140 are shown in FIG. 4, it is to be understood that the blade may be maintained in position without such connectors depending on the depth of grooves 300 and 320 and the length of the blade.

In an embodiment of the invention, blade 120 is engaged to frame attachment 100 by at least one connector 140 that extends through a side of the blade and into the side of a section of the frame attachment. Preferably, the blade contains (a) a connector that extends through the first side 260 of the blade an into the side of the first section of the frame attachment and (b) a connector that extends through the second side 280 of the blade and into the side of the second section of the frame attachment. The connector(s) may be screws. The connector(s) may be loosened to allow (a) movement of the blade in a direction substantially parallel to the first and second sections of the frame attachment and/or (b) the removal of the blade from the frame attachment. The connector(s) may be tightened to frictionally engage the frame assembly and thereby maintain the blade in a fixed position. In this manner, the connector(s) will not extend above the top surface of the blade and interfere with the positioning of the reticle into a stepper. The blade may also be constructed with a relatively high tolerance and have a length that is slightly greater than the shortest distance between the sides of the first and second sections of the frame attachment. It is to be understood that the blade may be engaged to the frame attachment in this manner in the absence of grooves 300 and 320 and inwardly disposed portions 270 and 290.

The movement of the blade along the first and second sections of the frame attachment preferably allows the blade to be positioned directly over undesired feature 80 to inhibit light from an illuminating source from impinging upon feature 80 and causing its image to be printed on a semiconductor wafer. Blade 120 preferably has a width that is greater than the size of undesired feature 80 such that the blade can effectively block light that would otherwise contact feature 80. The width of the blade preferably enables it to be positioned over feature 80 without inhibiting light from contacting device image 60. Thus, the width of blade 120 is preferably less than the shortest distance between section 150 of the frame attachment and device image 60.

In an embodiment of the invention, the top surface of blade 120 protrudes a distance above the top of the pellicle frame that is less than about 1.5 mm. Certain steppers (e.g., ASYL stepper) have a relatively low clearance distance between the stepper frame and the pellicle frame of the reticle located within the stepper. In some cases, the blade may interfere with the positioning of the reticle within the stepper if the blade protrudes from the top of the pellicle frame by more than about 1.5 mm. In an embodiment of the invention, the frame attachment has a sufficient thickness to provide a clearance between the bottom surface of the blade and pellicle 40. The clearance may prevent the blade from contacting the pellicle, thereby preventing contaminants on the blade from collecting on the pellicle material. In addition, the pellicle typically includes a thin film of cellophane or similar material that could be damaged if the blade was moved while in contact with the pellicle. The frame attachment preferably has a rounded top surface 210 or a raised lip on its top surface. The portion(s) of the blade (e.g., 160, 180) that contact the frame attachment may rest on the raised lip or rounded surface to provide a predetermined clearance between the bottom surface of the blade and the pellicle material. The blade preferably has a thickness less than about 10 mils, more preferably less than about 5 mils, and more preferably still about 1 mil.

It is preferred that the frame attachment and blade be constructed of a material that is adapted to withstand IT light exposure and relatively high temperatures. The frame attachment and blade may reach temperatures between 20° C. and 40° C. during wafer processing. It is preferred that the blade be constructed of a material that does not flake upon exposure to UV light and relatively high temperatures. Such flaking could produce particles that contaminate the wafer. The bottom surface of the blade is preferably substantially non-reflective so that light that reflects from the reticle surface to the bottom surface of the blade is not reflected back to the reticle surface at a non-perpendicular angle. The blade and frame attachment may be constructed of aluminum, stainless steel, or any other suitable material.

Figure 6:
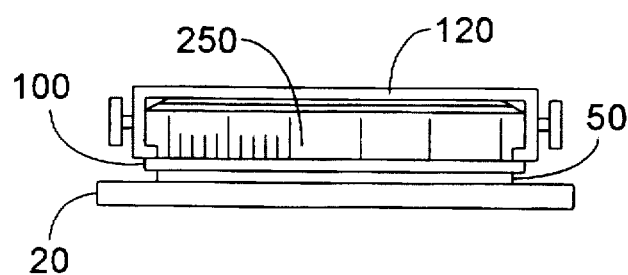
FIG. 6 depicts a side view of an embodiment of the invention.

It is preferred that the frame attachment is connected to the pellicle frame such that substantially no contact occurs between the frame attachment and the reticle surface. Contact between the frame attachment and the reticle may promote the transfer of contaminants from the frame attachment to the reticle surface. The frame attachment may fit onto the pellicle frame in the manner depicted in FIG. 6 such that a relatively small clearance exists between the bottom of the frame attachment and the reticle surface. The frame attachment preferably is secured to the pellicle frame essentially without distortion of the pellicle frame.

Figure 7:
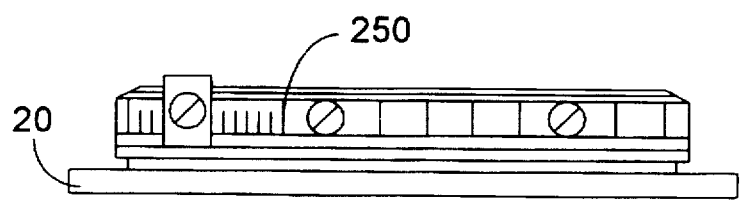
FIG. 7 depicts a side view of an embodiment of the invention.

In an embodiment of the invention depicted in FIG. 7, the frame attachment contains at least one reference vernier that may be used to facilitate positioning of blade 120. The reference vernier may contain appropriate markings (e.g., letters, numerals, ticks) to allow the blade to positioned at a precise location along the first and second sections of the frame attachment. The frame attachment may include a plurality of protrusions or indentions along one or more of its sections to facilitate the positioning of the blade such that it is precisely aligned with a marking of the reference vernier. The position of the blade along the first and second sections of the frame attachment is typically adjusted by an operator, and the vernier markings may aid the operator in moving the blades to a pre-determined position. A reference vernier is preferably located along the side of each section of the frame attachment. Each vernier preferably contains at least twenty markings which may be equally-spaced or spaced unevenly.

In an embodiment of the invention, frame attachment 100 is fixably engaged to a pellicle frame that is located on the side (i.e., glass side) of the reticle having a surface containing glass. When the reticle is loaded onto the stepper, the glass side of the reticle typically faces upward. The side of the reticle that is opposite the glass side (i.e., chrome side) typically has a surface that contains chromium and faces a reduction lens positioned below the reticle. The frame attachment is preferably fixed to a pellicle frame on the glass side of the reticle to reduce the likelihood that blade 120 or any portions of the frame attachment will fall onto and damage the reduction lens if they were inadvertently released from the pellicle frame. In addition, some reticles are periodically inspected for defects with the use of a quality control optical scanning system or similar device. The use of such devices is well known to those skilled in the art. The inspection of the reticle is typically performed on the chrome side of the reticle. A frame attachment and/or blade that is attached to a pellicle frame that is located on the chrome side would tend to interfere with such an inspection. If the frame attachment is located on the glass side of the reticle, it does not tend to interfere with the inspection of the reticle.

The proximity of blade 120 to the reticle surface preferably allows light from an overhead illuminating source to impinge upon device image 60 without casting a shadow onto the device image. The distance between the blade and the surface of the reticle is preferably less than about 15 mm, more preferably less than about 10 mm, and more preferably still less than about 5 mm. In a conventional method, a reticle masking blade is employed at a relatively great distance from the reticle surface. The reticle masking blade tends to cast a wider shadow relative to the blade width onto the reticle surface as compared to the blade of the present invention. It has been found that conventional reticle masking blades can cause a discontinous light pattern to impinge upon a device image 60 or an SLM structure 70 that typically is located adjacent to the device image and proximate a stepper alignment marking. It has been found that embodiments of the present invention may-achieve at least about a 5× reduction in aperture shadowing as compared to the conventional reticle masking blades in a typical ASM stepper. The configuration of the stepper tends to prevent the adjustment (e.g., lowering) of the reticle masking blades to overcome the problem of excessive shadowing onto the device image.

Additionally, blade 120 may have any of a number of various shapes to inhibit light from impinging upon an undesired feature that is proximate a device image. The blade may contain a notch or irregular shape such that it is "shaped around" a device image to avoid casting a shadow or projecting an uneven light distribution onto the device image. Blade 120 may also have any of a number of widths. The blade has a width that is less than about 1 inch, more preferably between about ¼ of an inch and about ½ of an inch, and more preferably still about ⅜ of an inch. The blade width may be chosen based on the location of the defect on the reticle surface or as a function of the distance between an undesired alignment marking and a portion of the frame attachment. For instance, a small blade width may be necessary when an undesired marking exists between the frame attachment and a device image if a relatively short distance exists between the frame attachment and the device image. In an embodiment, the blade has a sufficiently small width to allow it to be positioned over an undesired feature that exists between two device images without casting a shadow or a discontinuous light distribution over either of the device images. The manner in which conventional reticle masking blades are extended during use tends to disallow them to be positioned between two device images without covering one of the device images.

In some cases, the reticle may contain more than one undesired feature 80. In an embodiment of the invention, a plurality of blades 120 may be connected to the frame attachment. Although the blade in FIG. 3 is positioned across the width of the frame attachment, it is to be understood that one or more blades may be positioned across the length of the frame attachment as well. In an embodiment of the invention, a pair of undesired features 80 exist on opposite sides of the device image 60, and two blades on opposite sides of the device image extend across the frame attachment proximate the undesired features.

Thus, the apparatus of the present invention is adapted to prevent the image of the undesired feature from printing on the wafer without causing either shadowing on the device image or a discontinuous pattern of light to impinge upon the device image. The apparatus does not alter the surface of the reticle, and is suitable for use when the reticle contains small defects and/or relatively large undesired features (e.g., stepper alignment markings). In addition, the frame attachment may be easily removed from the pellicle frame to facilitate cleaning or inspection of the reticle. In the case that the reticle contains a stepper alignment marking and is used in conjunction with a stepper (e.g., ASM stepper) that does not require such a marking, the apparatus may be used to inhibit the printing of the image of the marking onto semiconductor material. The frame attachment may be subsequently removed from the pellicle frame, and the reticle may be used in conjunction with a stepper (e.g., GCA stepper) that requires the alignment marking.

It is to be appreciated that the frame attachment may be placed on a pellicle frame that is located on the chrome side or bottom side of the reticle. In such an embodiment, blade 120 is positioned below marking 80 to prevent ultraviolet light that passes through marking 80 from impinging upon the semiconductor material positioned below the reticle. The blade is preferably positioned such that it does not interfere with ultraviolet light that passes through device image 60. Although it is generally preferred that the frame attachment be located above the reticle surface, it is to be understood that preferred features described above may also be employed in combination with a frame attachment and blade positioned below the reticle surface.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An assembly for preventing an undesired reticle feature from printing on semiconductor material, comprising:

a reticle having a surface;

a pellicle frame attached to the reticle;

a pellicle drawn across the pellicle frame, the pellicle being adapted to prevent contaminant particles from contacting the reticle;

a frame attachment connected to the pellicle frame, the frame attachment comprising a first section and a second section, the first section and second section each having a top and a side, and wherein at least a portion of the first section is substantially parallel to at least a portion of the second section; and a blade comprising a first end and a second end, the blade being at least substantially opaque to ultraviolet light and extending across the frame attachment such that the first end of the blade is engaged with the frame attachment proximate the first section and the second end of the blade is engaged with the frame attachment proximate the second section, and wherein the blade is adapted to move in a direction substantially parallel to the first section and the second section.

2. The assembly of claim 1, wherein the reticle comprises a device image and a marking substantially transparent to ultraviolet light, and wherein the blade is positioned substantially above the marking during use to inhibit ultraviolet light from contacting the marking without inhibiting ultraviolet light from contacting the device image.

3. The assembly of claim 1, wherein the reticle comprises a device image and a marking that is substantially transparent to ultraviolet light, and wherein the blade is positioned during use to cast a shadow onto the surface of the reticle, and wherein the marking is located substantially within the shadow and the device image is located substantially outside of the shadow.

4. The assembly of claim 1, further comprising a second blade engaged with the frame attachment, the second blade being adapted to move in a direction substantially parallel to at least a portion of the first section of the frame attachment.

5. The assembly of claim 1, wherein the frame attachment is mounted onto the pellicle frame such that a separation exists between the surface of the reticle and the frame attachment.

6. The assembly of claim 1, wherein the frame attachment further comprises a raised surface, and wherein the first end of the blade engages a first portion of the raised surface and the second end of the blade engages a second portion of the raised surface such that a pre-determined separation exists between the blade and the pellicle.

7. The assembly of claim 1, wherein the pellicle frame further comprises a side surface, and wherein the frame attachment is mounted on the pellicle frame, and further comprising a connector extending from the frame attachment into the side surface of the pellicle frame, thereby providing a fixable engagement between the pellicle frame and the frame attachment.

8. The assembly of claim 1, further comprising a connector extending through the blade and into the top of the frame attachment, the connector providing a fixable engagement between the blade and the frame attachment.

9. The assembly of claim 1, further comprising a connector extending into the side of the frame attachment, the connector providing a fixable engagement between the blade and the frame attachment.

10. The assembly of claim 1, wherein the blade further comprises a surface that extends from the first end of the blade to the second end of the blade, the surface of the blade being substantially parallel to the surface of the reticle.

11. The assembly of claim 1, wherein the first end of the blade is frictionally engaged with the first section of the frame attachment and the second end of the blade is frictionally engaged with the second section of the frame attachment, and wherein the blade slides on top of the first and second sections of the frame attachment upon receiving a predetermined force during use.

12. The assembly of claim 1, wherein the blade has a thickness of less than about 5 mil.

13. The assembly of claim 1, wherein the frame attachment further comprises a reference vernier on the side of at least one of the first and second sections, the reference vernier comprising a plurality of markings for identifying a location of the blade.

14. The assembly of claim 1, wherein the reticle further comprises a glass side and a chrome side, and wherein the frame attachment is attached to the pellicle frame on the glass side of the reticle.

15. The assembly of claim 1, wherein the blade comprises aluminum.

16. The assembly of claim 1, wherein the reticle further comprises a device, and wherein the blade further comprises a notched portion through which ultraviolet light can pass, and wherein the blade is positioned during use such that the notched portion is located substantially above the device.

17. The assembly of claim 1, wherein the blade is spaced from the reticle surface at a distance that is less than about 15 mm.

18. The assembly of claim 1, wherein the blade comprises a bottom surface having substantially non-reflective material to inhibit the reflection of light from the bottom surface of the blade to the reticle.

19. The assembly of claim 1, wherein the side of the first section further comprises a first groove extending substantially along the length of the first section, and wherein the side of the second section further comprises a second groove extending substantially along the length of the second section, and wherein the first end of the blade comprises a first inwardly disposed protrusion adapted to fit within the first groove, and wherein the second end of the blade comprises a second inwardly disposed protrusion adapted to fit within the second groove.

20. The assembly of claim 1, wherein the frame attachment further comprises a third section connecting the first section to the second section, the third section being substantially perpendicular to the first section and the second section.

21. The assembly of claim 1, wherein the reticle comprises a device image and a feature substantially transparent to ultraviolet light, and wherein the blade is positioned substantially below the feature during use to inhibit ultraviolet light that passes through the feature from impinging upon the semiconductor material.

22. A pellicle frame attachment device for preventing an undesired reticle feature from printing on semiconductor material, comprising:

a frame attachment comprising a first section and a second section; and a blade comprising a first end and a second end, the blade being at least substantially opaque to ultraviolet light and extending across the frame attachment such that the first end of the blade is engaged with the frame attachment proximate the first section and the second end of the blade is engaged with the frame attachment proximate the second section, and wherein the blade is moveable in a direction substantially parallel to the first section and the second section.

23. A method for preventing an undesired reticle feature from printing on semiconductor material, comprising:

positioning an assembly at a location substantially above the semiconductor material, the assembly comprising:

a reticle having a surface, the surface of the reticle comprising a device image and a marking;

a pellicle frame attached to the reticle;

a pellicle drawn a spaced distance above the pellicle frame;

a frame attachment connected to the pellicle frame, the frame attachment comprising a first section and a second section, the first section and second section each having a top and a side, and wherein at least a portion of the first section is substantially parallel to at least a portion of the second section; and a blade comprising a first end and a second end, the blade being substantially opaque to ultraviolet light and extending across the frame attachment such that the first end of the blade is engaged with the frame attachment proximate the first section and the second end of the blade is engaged with the frame attachment proximate the second section, and wherein the blade is adapted to move in a direction substantially parallel to the first section and the second section;

positioning the blade substantially over the marking to cast a shadow onto the surface of the reticle such that the marking is located substantially within the shadow and the device image is located substantially outside of the shadow; and passing ultraviolet light from an ultraviolet light source towards the assembly to print the device image onto the semiconductor material.

* * * * *